(12) United States Patent
Hu et al.

(10) Patent No.: US 10,991,796 B2
(45) Date of Patent: Apr. 27, 2021

(54) SOURCE/DRAIN CONTACT DEPTH CONTROL

(71) Applicant: GLOBALFOUNDRIES U.S. Inc., Santa Clara, CA (US)

(72) Inventors: Lin Hu, Malta, NY (US); Veeraraghavan S. Basker, Schenectady, NY (US); Brian J. Greene, Wappingers Falls, NY (US); Kai Zhao, Hopewell Junction, NY (US); Daniel Jaeger, Saratoga Springs, NY (US); Keith Tabakman, Wilton, NY (US); Christopher Nassar, Malta, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/231,671

(22) Filed: Dec. 24, 2018

(65) Prior Publication Data
US 2020/0203480 A1    Jun. 25, 2020

(51) Int. Cl.
*H01L 29/06* (2006.01)
*H01L 29/417* (2006.01)
*H01L 29/66* (2006.01)
*H01L 21/8234* (2006.01)
*H01L 29/78* (2006.01)

(52) U.S. Cl.
CPC .. *H01L 29/0653* (2013.01); *H01L 21/823418* (2013.01); *H01L 21/823431* (2013.01); *H01L 29/41791* (2013.01); *H01L 29/6681* (2013.01); *H01L 29/785* (2013.01); *H01L 2029/7858* (2013.01)

(58) Field of Classification Search
CPC ................................................. H01L 29/66795
See application file for complete search history.

(56) References Cited

U.S. PATENT DOCUMENTS

2016/0276429 A1\* 9/2016 Tseng .................. H01L 29/7851

\* cited by examiner

*Primary Examiner* — Yu-Hsi D Sun
(74) *Attorney, Agent, or Firm* — David Cain; Hoffman Warnick LLC (57) ABSTRACT

A dielectric fill layer within source/drain metallization trenches limits the depth of an inlaid metallization layer over isolation regions of a semiconductor device. The modified geometry decreases parasitic capacitance as well as the propensity for electrical short circuits between the source/drain metallization and adjacent conductive structures, which improves device reliability and performance.

10 Claims, 8 Drawing Sheets

SOURCE/DRAIN CONTACT DEPTH CONTROL

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin semiconductor fins, e.g., 20 nm wide or less, on the surface of a substrate using selective-etching techniques. A functional gate is then deposited to contact multiple surfaces of each fin to form a multi-gate architecture.

The functional gate may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation. A gate including a gate dielectric and a gate conductor is deposited to contact multiple surfaces of each fin within the channel regions thereof. Interlayer dielectric and metallization layers are deposited to provide electrical contacts both the gate and the source/drain regions.

In certain architectures, metallization layers for the source/drain regions may extend over shallow trench isolation, i.e., over non-contacted regions between adjacent fins, as well as within a fin cut region where a selected fin has been severed to isolate independent devices. The proximity to adjacent conductive structures of the source/drain metallization layers located within these inactive regions can introduce unwanted parasitic capacitance as well as a propensity for electrical short circuits between the conductive structures.

SUMMARY

Accordingly, it would be beneficial to provide a method for forming source/drain contacts at advanced nodes, especially source/drain contacts that are electrically isolated from adjacent conductive structures without altering design rules or otherwise compromising real estate.

Disclosed is a method for limiting the depth of source/drain contacts, as well as the resulting structure. An example method includes providing a semiconductor structure disposed over a semiconductor substrate, the semiconductor structure including (i) a semiconductor fin having alternating channel and source/drain regions, (ii) a shallow trench isolation layer disposed over the substrate laterally adjacent to a lower portion of the fin and within the fin cut opening between cut ends of the fin, (iii) an oxide layer disposed directly over and extending into the shallow trench isolation layer within the fin cut opening. The method further includes forming a liner completely filling a space defined by the oxide layer within the fin cut opening, the liner further defining sidewalls and a bottom of a first trench over the shallow trench isolation layer, the first trench having a bottom surface above a top surface of the shallow trench isolation layer and defined by a top surface of the oxide layer.

A semiconductor device includes a semiconductor fin having alternating channel and source/drain regions disposed over a semiconductor substrate, a shallow trench isolation layer disposed over the semiconductor substrate laterally adjacent to a lower portion of the fin and within a fin cut opening between cut ends of the fin, and an oxide layer disposed directly over and extending into the shallow trench isolation layer within the fin cut opening. A conformal liner completely filling a space defined by the oxide layer within the fin cut opening, the conformal liner defining sidewalls and a bottom of a first trench over the shallow trench isolation layer, where the first trench has a bottom surface above a top surface of the shallow trench isolation layer and defined by a top surface of the oxide layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

As described herein, the formation or deposition of a layer or structure may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

Disclosed herein are methods for manufacturing FinFET devices, and more particularly methods and structures where the depth of source/drain contacts within inactive device regions is controlled in order to decrease parasitic capacitance and incidences of electrical short circuits between the source/drain contacts and neighboring conductive structures, which adversely affect device performance. Example methods for controlling the source/drain contact depth within isolation regions are described herein with reference to FIGS. 2-7.

Figure 1:
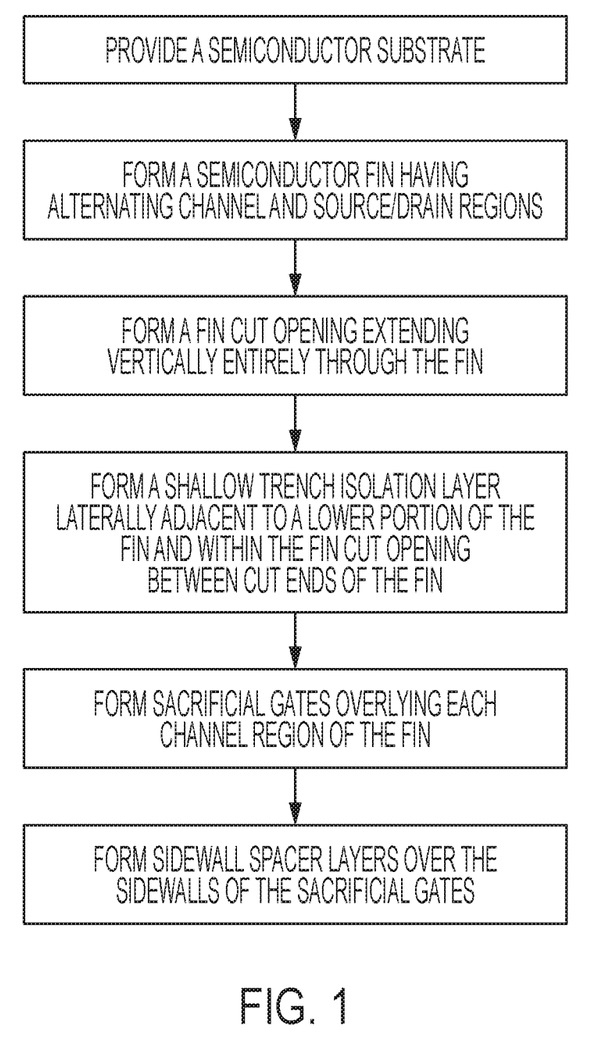
FIG. 1 is a flow diagram for a method of fabricating a FinFet device to an intermediate stage of formation.
Figure 2:
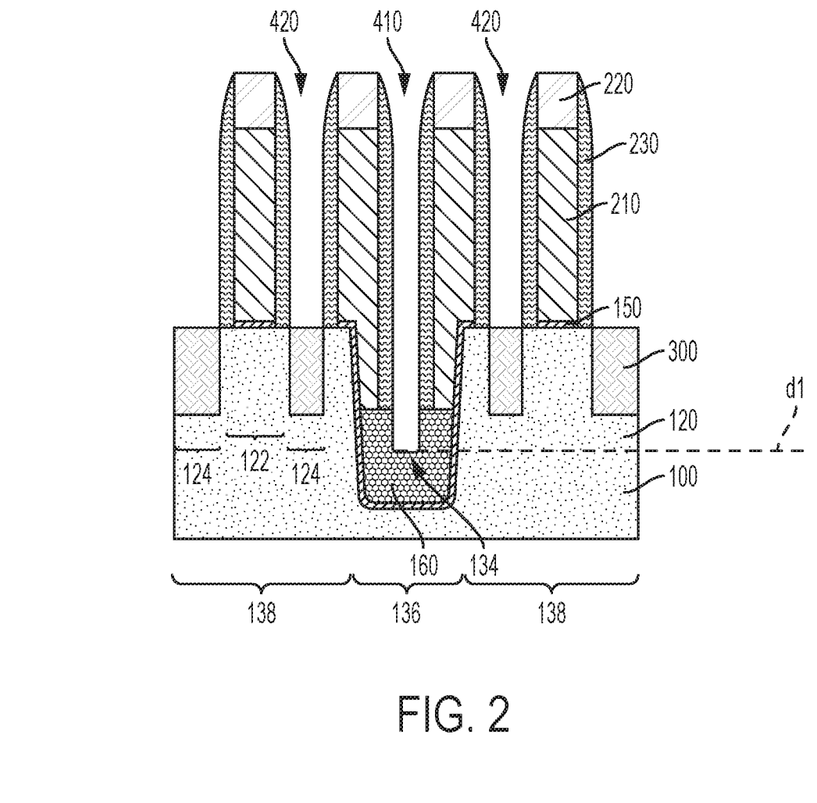
FIG. 2 is a cross-sectional schematic diagram of a FinFET device architecture at the intermediate stage of fabrication of FIG. 1 following the formation of sacrificial gates and source/drain regions over a semiconductor fin.

FIG. 1 shows a flow diagram for a method of fabricating a FinFet device to the intermediate stage. The device of this intermediate stage of production is illustrated in FIG. 2. The various process steps of FIG. 1 are described with cross reference to FIG. 2. As shown in FIG. 1, a semiconductor substrate is provided and a semiconductor fin is formed having alternating channel and source/drain regions; a fin cut opening extending vertically completely though the fin is then formed. Referring now to FIG. 2, a semiconductor fin 120 is formed over a semiconductor substrate 100. The semiconductor substrate may be a bulk substrate or a composite substrate such as a semiconductor-on-insulator (SOI) substrate, and may include any suitable semiconductor material as known to those skilled in the art. Portions of the semiconductor substrate 100 may be amorphous, polycrystalline, or single crystalline.

In various embodiments, each fin 120 includes a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art. Although a single fin 120 is shown in the illustrated cross-section, it will be appreciated that an array of fins may be formed over the substrate 100.

Each fin 120 can include a single crystal semiconductor material that extends along a lengthwise direction. As used herein, a "lengthwise direction" is a horizontal direction along with an object extends the most. A "widthwise direction" is a horizontal direction that is perpendicular to the lengthwise direction. As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

In certain embodiments, the fins 120 can have a width of 5 nm to 20 nm, and a height of 40 nm to 150 nm, although other dimensions are contemplated. In structures including plural fins, i.e., a fin array, each fin 120 may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Plural fins are typically oriented parallel to each other and perpendicular to the library logic flow of a circuit. After fin formation, a fin cut or fin removal process may be used to eliminate unwanted fins or unwanted portions thereof for the particular circuit or device being fabricated. Thus, the fin-to-fin periodicity may be constant or variable over an array of fins.

Following fin formation, a fin cut module is used to sever selected fins 120 to create a fin cut opening 134 extending entirely through the fin within isolation region 136. Isolation region 136 may include a single diffusion break or double diffusion break architecture between opposing ends of a cut fin. The segmented fin 120 includes alternating channel regions 122 and source/drain regions 124.

In accordance with various embodiments, portions of the fin 120 may be coated with a thin conformal oxide layer. The thin conformal oxide layer is referred to herein as an extended gate or EG oxide layer 150. The EG oxide layer 150 may include silicon dioxide, for example, and may be formed over fins 120 within active device regions 138, as well as over the semiconductor substrate within inactive region 138. The EG oxide layer 150 may have a thickness of 2 to 3 nm. During the course of manufacturing the FinFET device, the EG oxide 150 may be stripped from channel regions 122 of the fins, e.g., prior to the formation of a functional gate and/or from source and drain regions 124 of the fins, e.g., prior to forming epitaxial or implanted source/drain junctions.

As shown in FIG. 1, a shallow trench isolation layer is formed laterally adjacent to a lower portion of the fin and within the fin cut opening between the cut ends of the fin. Referring now to FIG. 2, this shallow trench isolation (STI) layer 160 may be formed over the semiconductor substrate 100, i.e., between fins 120 and within isolation region 136 by initially etching the semiconductor substrate 100 to form isolation trenches, and then backfilling the isolation trenches with a dielectric material such as silicon dioxide. The STI layer may be disposed laterally adjacent to the fins. The deposited dielectric material may be polished by a chemical-mechanical polishing (CMP) process that removes the excess dielectric material and creates a planar STI structure. The planarized oxide is then etched back to form a recessed, uniformly thick oxide isolation layer 160 between the fins 120, where upper sidewalls of the fins 120 can be exposed for further processing. Shallow trench isolation (STI) layer 160 may be used to provide electrical isolation between the fins 120 located in active regions 138, and between adjacent devices as is needed for the circuit(s) being implemented.

Illustrated in FIG. 2 is a post-junction module replacement metal gate (RMG) architecture following formation of a sacrificial gate 210 over a respective channel region 122 of the fin 120. A hard mask 220 overlies the sacrificial gate 210. Sidewall spacers 230 are formed over vertical sidewalls of the sacrificial gate 210 and the hard mask 220.

As shown in FIG. 1, sacrificial gates overlying each channel region of the fin are formed. Referring now to FIG. 2, sacrificial gate 210 and overlying hard mask 220 may be formed using conventional deposition, photolithography and etching processes. The sacrificial gate 210 may include a layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The hard mask 220 may include a dielectric material such as silicon nitride, and may be formed using chemical vapor deposition.

The sacrificial gate 210 may have a thickness sufficient to completely cover the fins 120. For instance, a thickness of sacrificial gate 210 may range from 50 to 200 nm, e.g., 50, 75, 100, 125, 150, 175 or 200 nm, including ranges between any of the foregoing values, although lesser and greater thicknesses may be used.

As will be described in further detail below, sacrificial gate 210 is adapted to provide a temporary structure for a replacement metal gate (RMG) module that is used to form a functional gate over each channel region 122 of the fin 120. As used herein, a "functional gate" refers to a structure used to control output current (i.e., the flow of carriers through a channel) of a semiconductor device using an electrical field or, in some instances, a magnetic field, and includes a gate dielectric and a gate conductor. Metallization of the functional gates and the source/drain regions may be used to form operable devices.

As shown in FIG. 1, sidewall spacers layers over each of the sacrificial gates are formed. Referring to FIG. 2, sidewall spacers 230 are disposed over sidewalls (vertical surfaces) of the sacrificial gate 210 and gate hard mask 220. The sidewall spacers 230 may be formed by blanket deposition of a spacer material (e.g., using atomic layer deposition) followed by a directional etch such as reactive ion etching (RIE) to remove the spacer material from horizontal surfaces. In certain embodiments, the sidewall spacer thickness is 4 to 20 nm, e.g., 4, 10, 15 or 20 nm, including ranges between any of the foregoing values.

The sacrificial gate 210 and sidewall spacers 230 are used to template the formation of source/drain junctions 300 over each source/drain region 124 of the fin 120. Source/drain junctions 300 may be formed by ion implantation or selective epitaxy using the sidewall spacers 230 as an alignment mask.

According to various embodiments, source/drain junctions 300 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Example epitaxial growth processes include low energy plasma deposition, liquid phase epitaxy, molecular beam epitaxy, and atmospheric pressure chemical vapor deposition.

The source/drain junctions 300 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 300 may be diffused into the semiconductor fin 120 using a post-epitaxy or post-implantation anneal (e.g., at a temperature of 600° C. to 1400° C.) to create a desired dopant profile within the fin.

The sacrificial gate architecture defines metallization trenches, including first trenches 410 overlying STI 160 within inactive, isolation regions 136, and second trenches 420 over source/drain regions of fin 120, i.e., within active regions 138. In a comparative process, following deposition of a conformal etch stop layer within the trenches 410, 420, a source/drain metallization layer is formed over source/drain junctions 300 within active device regions 138, as well as over STI 160 at non-contact locations within inactive device regions 136. However, as will be appreciated with reference to FIG. 2, within inactive region 136, i.e., over STI 160, the metallization layer may extend through a substantial portion of the fin 120 to a depth d1. Thus, in various comparative structures, a lower surface of the source/drain metallization may be below a lower surface of the source/drain junctions 300 and in close proximity to the fins 120. In various embodiments, the depth of first trenches 410 and hence the depth of the metallization filling the first trenches 410 is controlled. In particular embodiments, bottoms of the first trenches 410 are filled with a dielectric layer prior to forming the metallization layer(s) within first and second trenches 410, 420 in order to decrease the depth of the first trenches 410.

Figure 3:
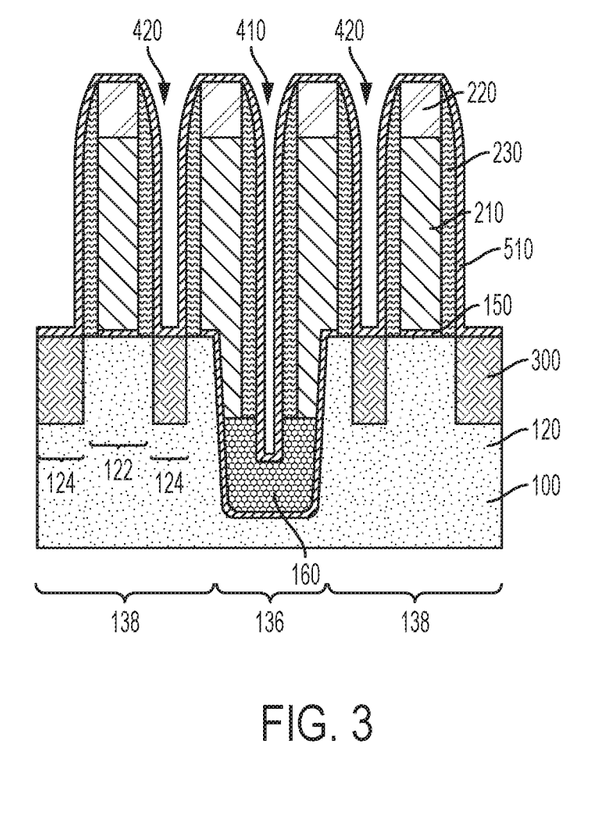
FIG. 3 depicts the deposition of an oxide layer within trenches over the sacrificial gates.

Referring to FIG. 3, a conformal oxide layer 510 is deposited over the sacrificial gates and within first and second trenches 410, 420. The conformal oxide layer 510 covers the trench sidewalls without pinching off. At the bottom of first trench 410, the conformal oxide layer 510 is disposed directly over STI layer 160. The conformal oxide layer 510 may include silicon dioxide, for example, and may be formed by atomic layer deposition. A thickness of conformal oxide layer 510 may range from 2 to 10 nm, e.g., 2, 4, 6, 8, or 10 nm, including ranges between any of the foregoing values.

In various embodiments, the oxide layer 510 and the sidewall spacers 230 are formed from materials that can be etched selectively to one another. In particular embodiments, the oxide layer 510 includes silicon dioxide and the sidewall spacers 230 include silicon nitride.

As used herein, the compounds silicon dioxide and silicon nitride have compositions that are nominally represented as $SiO_2$, and $Si_3N_4$, respectively. However, the terms silicon dioxide and silicon nitride refer to not only these stoichiometric compositions, but also to oxide and nitride compositions that deviate from the stoichiometric compositions.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Figure 4:
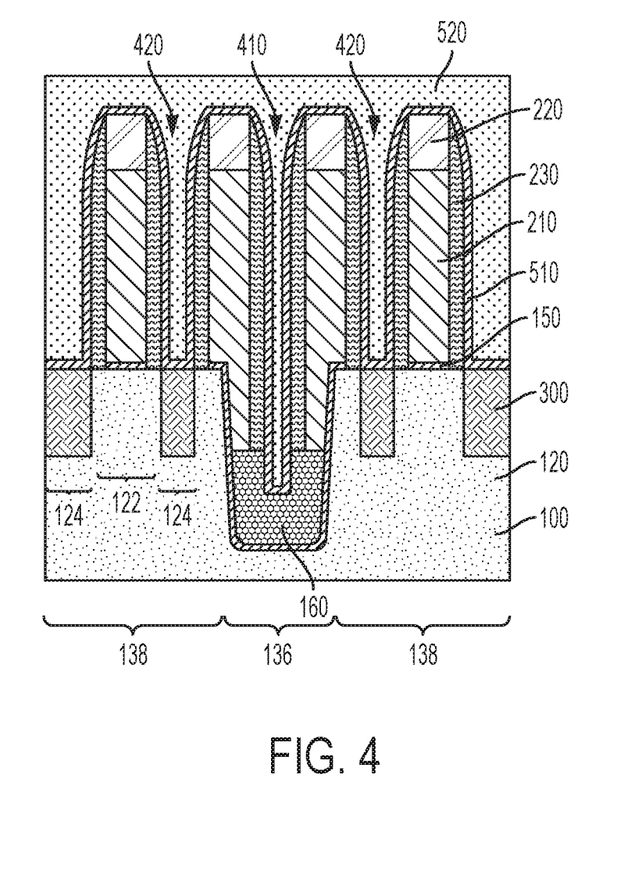
FIG. 4 shows the blanket deposition of an organic planarization layer over the structure of FIG. 3.

FIG. 4 shows the deposition of a sacrificial dielectric layer 520 within first trenches 410 over STI 160 and within second trenches 420 over source/drain junctions 300. In certain embodiments, sacrificial dielectric layer 520 completely fills the trenches 410, 420. Sacrificial dielectric layer 520 may include an organic planarization layer (OPL) or flowable oxide. An example sacrificial dielectric layer 520 includes amorphous carbon, which may be deposited by spin-coating.

According to various embodiments, sacrificial dielectric layer 520 may include a photo-sensitive organic polymer that, when exposed to electromagnetic radiation, is chemically altered and thus configured to be removed using a developing solvent. For instance, a photo-sensitive organic polymer may be include a polyacrylate resin, epoxy resin, phenol resin, polyamide resin, polyimide resin, unsaturated polyester resin, polyphenylenether resin, polyphenylenesulfide resin, or benzocyclobutene.

Figure 5:
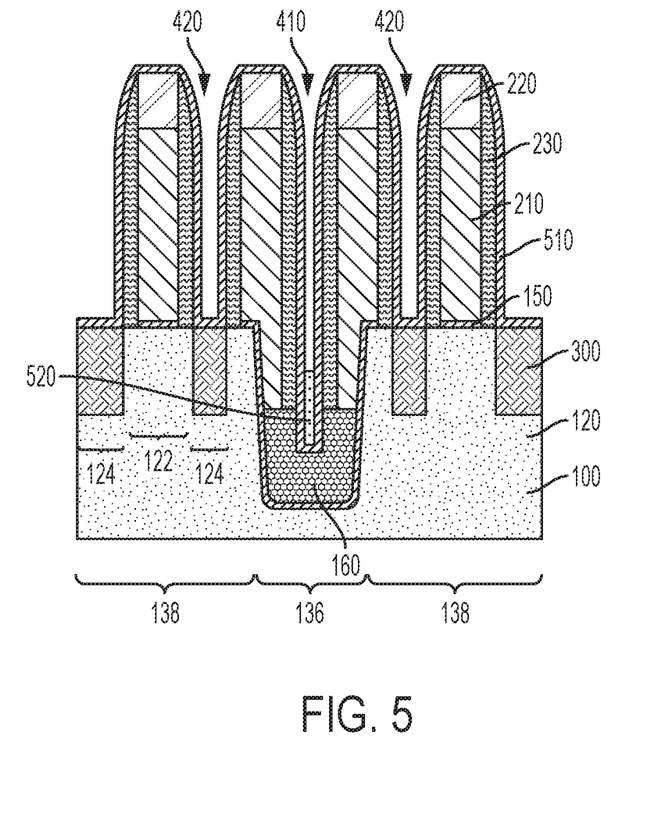
FIG. 5 depicts a recess etch of the organic planarization layer and the retention of a portion of the organic planarization layer over the oxide layer within an inactive region of the device.

Referring to FIG. 5, a recess etch of the sacrificial dielectric layer 520 is performed selectively with respect to the oxide layer 510. Following the recess etch, the sacrificial dielectric layer 520 is completely removed from within second trenches 420 over source/drain junctions 300, while a portion of the sacrificial dielectric layer 520 is retained within the first trench 410 over STI 160 within inactive region 136. Without wishing to be bound by theory, the relatively low aspect ratio of the second trenches 420 over source/drain junctions 300 relative to the first trench 410 over STI enables the sacrificial dielectric layer 520 to be removed from the second trenches 420. In the illustrated embodiment, a top surface of the retained portion of the sacrificial dielectric layer 520 within first trench 410 is disposed above a bottom surface of the adjacent source/drain junctions 300. Within the first trench 410, the retained portion of the sacrificial dielectric layer 520 is adapted to function as a blocking layer and inhibit etching of underlying portions of the oxide layer 510.

Figure 6:
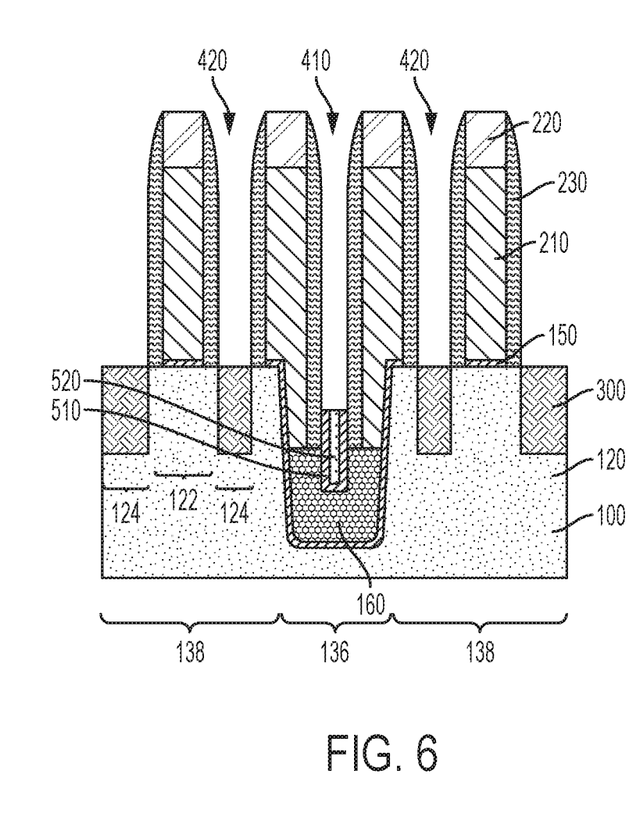
FIG. 6 shows etching of the oxide layer over active regions of the device and retention a portion of the oxide layer over shallow trench isolation.
Figure 7:
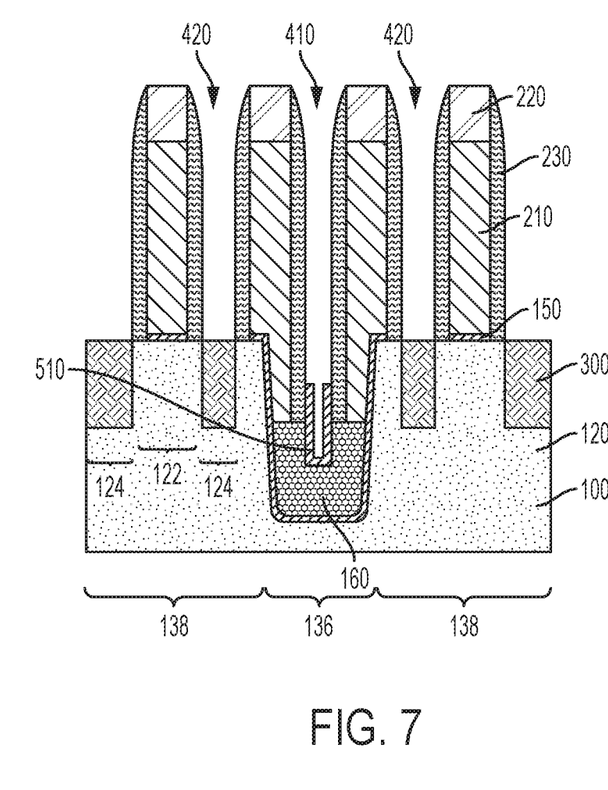
FIG. 7 depicts removal of remaining portions of the organic planarization layer.

Referring to FIG. 6, a further etching step is used to remove portions of the oxide layer 510 unblocked by the sacrificial dielectric layer 520. As illustrated, the oxide layer is removed from within the second trenches 420 to expose the source/drain junctions 300, and also from within an upper region of the first trench 410 directly over STI 160. Following the further etching step, the oxide layer 510 and the sacrificial dielectric layer 520 are disposed within a lower region of the first trench 410. Referring to FIG. 7, the sacrificial dielectric layer 520 is stripped selectively with respect to the oxide layer 510. As seen in FIG. 7, the un-etched portion of oxide layer 510 is disposed over STI 160 and defines a raised bottom within the first trench 410. The remaining portions of the oxide layer 510 thus form a plug at the bottom of the first trench 410 and effectively raise a lower surface of the first trench 410.

Figure 8:
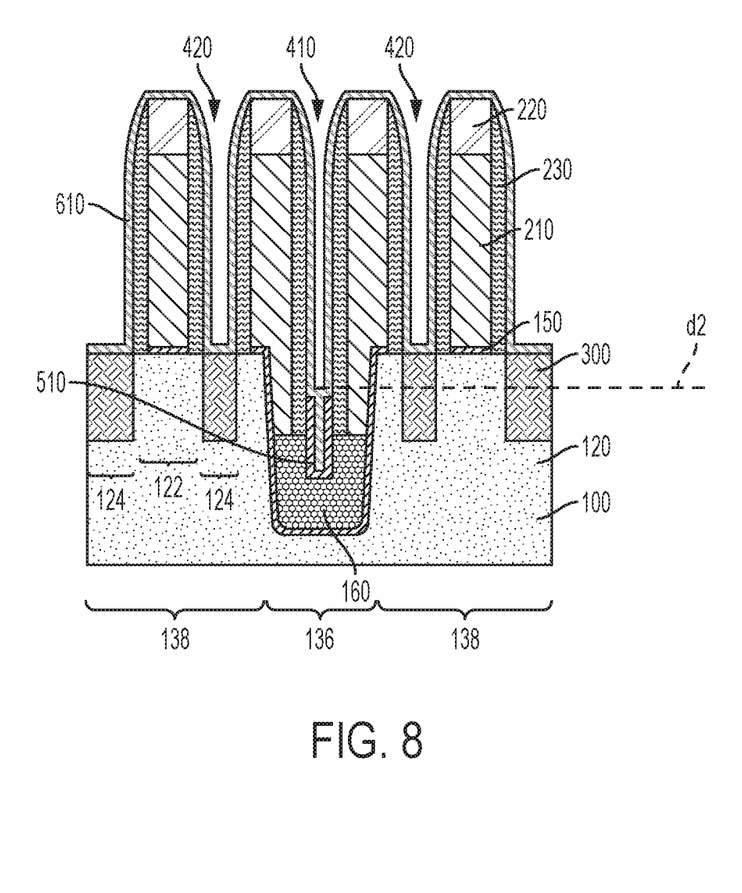
FIG. 8 shows the conformal deposition of a contact etch stop layer over the sacrificial gates and within the trench over shallow trench isolation.

Referring to FIG. 8, a conformal liner 610 is formed over the sacrificial gates within first and second trenches 410, 420. The conformal liner 610 is adapted to function as a contact etch stop layer (CESL), and may include silicon nitride, for example. Conformal liner may be deposited by atomic layer deposition. In the illustrated embodiment, a bottom surface of the conformal liner 610 is below a top surface of the shallow trench isolation layer 160. At this stage of manufacture, lower portions of the first trench 410 over STI 160 are filled with the oxide layer 510 and the conformal liner 610, which prevents a later-formed contact metallization layer from extending lower than a depth d2, which is above the depth d1 from the comparative example.

As used herein, the singular forms "a," "an" and "the" include plural referents unless the context clearly dictates otherwise. Thus, for example, reference to a "semiconductor fin" includes examples having two or more such "semiconductor fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a sacrificial gate that comprises or includes amorphous silicon include embodiments where a sacrificial gate layer consists essentially of amorphous silicon and embodiments where a sacrificial gate consists of amorphous silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a device, comprising:
providing a semiconductor structure disposed over a semiconductor substrate, the semiconductor structure comprising (i) a semiconductor fin comprising alternating channel and source/drain regions, (ii) a shallow trench isolation layer disposed over the semiconductor substrate laterally adjacent to a lower portion of the fin and within a fin cut opening between cut ends of the fin, (iii) an oxide layer disposed directly over and extending into the shallow trench isolation layer within the fin cut opening; and
forming a liner completely filling a space defined by the oxide layer within the fin cut opening, wherein the oxide layer extends above the shallow trench isolation layer and a side surface of the oxide layer above the shallow trench isolation layer abuts a side wall spacer, the space forming a hollow extending from above the shallow trench isolation layer and into the shallow trench isolation layer, the liner completely filling the hollow, the liner further defining sidewalls and a bottom of a first trench over the shallow trench isolation layer, the first trench having a bottom surface above a top surface of the shallow trench isolation layer and defined by a top surface of the oxide layer.

2. The method of claim 1 wherein the liner is conformal liner.

3. The method of claim 1, further comprising source/drain junctions disposed over the source/drain regions of the semiconductor fin.

4. The method of claim 1, wherein the top surface of the oxide layer is disposed above a bottom surface of the source/drain regions.

5. The method of claim 1 wherein the forming of the liner comprises atomic layer deposition.

6. The method of claim 1 wherein the liner comprises silicon nitride.

7. A semiconductor device, comprising:
- a semiconductor fin comprising alternating channel and source/drain regions disposed over a semiconductor substrate;
- a shallow trench isolation layer disposed over the semiconductor substrate laterally adjacent to a lower portion of the fin and within a fin cut opening between cut ends of the fin;
- an oxide layer disposed directly over and extending into the shallow trench isolation layer within the fin cut opening; and
- a conformal liner completely filling a space defined by the oxide layer within the fin cut opening, wherein the oxide layer extends above the shallow trench isolation layer and a side surface of the oxide layer above the shallow trench isolation layer abuts a side wall spacer, the space forming a hollow extending from above the shallow trench isolation layer and into the shallow trench isolation layer, the liner completely filling the hollow, the conformal liner further defining sidewalls and a bottom of a first trench over the shallow trench isolation layer, the first trench having a bottom surface above a top surface of the shallow trench isolation layer and defined by a top surface of the oxide layer.

8. The semiconductor device of claim 7, further comprising source/drain junctions disposed over the source/drain regions of the semiconductor fin.

9. The semiconductor device of claim 8, wherein a top surface of the oxide layer is disposed above a bottom surface of the source/drain junctions.

10. The semiconductor device of claim 7, wherein the shallow trench isolation layer and the oxide layer each comprise silicon dioxide.

* * * * *